United States Patent
Elsherbini et al.

(10) Patent No.: US 9,129,817 B2
(45) Date of Patent: Sep. 8, 2015

(54) MAGNETIC CORE INDUCTOR (MCI) STRUCTURES FOR INTEGRATED VOLTAGE REGULATORS

(71) Applicants: Adel A. Elsherbini, Chandler, AZ (US); Kevin P. O'Brien, Portland, OR (US); Henning Braunisch, Chandler, AZ (US); Krishna Bharath, Chandler, AZ (US)

(72) Inventors: Adel A. Elsherbini, Chandler, AZ (US); Kevin P. O'Brien, Portland, OR (US); Henning Braunisch, Chandler, AZ (US); Krishna Bharath, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 130 days.

(21) Appl. No.: 13/801,623

(22) Filed: Mar. 13, 2013

(65) Prior Publication Data
US 2014/0264732 A1 Sep. 18, 2014

(51) Int. Cl.
| | |
|---|---|
| H01L 27/08 | (2006.01) |
| H01L 27/06 | (2006.01) |
| H01L 23/64 | (2006.01) |
| H01L 25/16 | (2006.01) |
| H01L 27/01 | (2006.01) |
| H01L 49/02 | (2006.01) |

(52) U.S. Cl.
CPC .............. H01L 27/06 (2013.01); H01L 23/64 (2013.01); H01L 25/16 (2013.01); H01L 27/016 (2013.01); H01L 28/10 (2013.01); H01L 28/40 (2013.01); H01L 2924/0002 (2013.01)

(58) Field of Classification Search
USPC ........... 257/531, 686, 724; 323/282; 327/540; 438/4
See application file for complete search history.

(56) References Cited

U.S. PATENT DOCUMENTS

| | | | |
|---|---|---|---|
| 6,175,727 B1 * | 1/2001 | Mostov | 455/307 |
| 7,518,481 B2 | 4/2009 | Gardner et al. | |
| 7,652,348 B1 * | 1/2010 | Hopper et al. | 257/531 |
| 8,108,984 B2 | 2/2012 | Gardner et al. | |
| 2004/0140877 A1 * | 7/2004 | Nakao et al. | 336/200 |
| 2010/0259911 A1 * | 10/2010 | Gardner et al. | 361/783 |
| 2012/0319236 A1 * | 12/2012 | Chen et al. | 257/531 |
| 2013/0257525 A1 * | 10/2013 | Kosonocky et al. | 327/540 |
| 2013/0320943 A1 * | 12/2013 | Meehan et al. | 323/282 |

OTHER PUBLICATIONS

Notice of Preliminary Rejection from Korean Patent Application No. 2014-0027987 mailed Apr. 16, 2015, 6 pgs.

* cited by examiner

Primary Examiner — Errol Fernandes
(74) Attorney, Agent, or Firm — Blakely, Sokoloff, Taylor & Zafman LLP

(57) ABSTRACT

Semiconductor packages including magnetic core inductor (MCI) structures for integrated voltage regulators are described. In an example, a semiconductor package includes a package substrate and a semiconductor die coupled to a first surface of the package substrate. The semiconductor die has a first plurality of metal-insulator-metal (MIM) capacitor layers thereon. The semiconductor package also includes a magnetic core inductor (MCI) die coupled to a second surface of the package substrate. The MCI die includes one or more slotted inductors and has a second plurality of MIM capacitor layers thereon.

18 Claims, 8 Drawing Sheets

(a)

(b)

US 9,129,817 B2

MAGNETIC CORE INDUCTOR (MCI) STRUCTURES FOR INTEGRATED VOLTAGE REGULATORS

TECHNICAL FIELD

Embodiments of the invention are in the field of semiconductor packages and, in particular, semiconductor packages including magnetic core inductor (MCI) structures for integrated voltage regulators.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. For example, some semiconductor packages now use a coreless substrate, which does not include the thick resin core layer commonly found in conventional substrates. Furthermore, the demand for higher performance devices results in a need for an improved semiconductor package that enables a thin packaging profile and low overall warpage compatible with subsequent assembly processing.

On the other hand, although scaling is typically viewed as a reduction in size, the addition of functionality in a given space is also considered. However, structural issues may arise when attempting to package semiconductor die with additional functionality also housed in the package. For example, the addition of packaged inductors may add functionality, but ever decreasing space availability in a semiconductor package may provide obstacles to adding such functionality.

On-die voltage regulation can be used to locally change the voltage, e.g., within core voltage changes, for active power management. Additionally, On-die voltage regulation can also be designed to automatically maintain a constant voltage level for an associated semiconductor die. In another application, on-die voltage regulation can also be used to throttle voltages in real time if active power management required. A voltage regulator may be a simple "feed-forward" design or may include negative feedback control loops. It may use an electromechanical mechanism, or electronic components. Depending on the design, it may be used to regulate one or more AC or DC voltages.

Electronic components, such as inductors, may be implemented on substrates such as an integrated circuit die or a printed circuit board (PCB). Such implementations involve placing patterns of material (e.g., a conductive material) on one or more substrate layers. This placement may be through lithographic techniques. Inductors used for RF applications are typically air-core spiral inductors or, in some cases, ferrite magnetic inductors. Various drawbacks are associated with these inductors. For instance, air-core spiral inductors typically require a substantial amount of space (area) on a substrate (e.g., an IC die). Moreover, such inductors typically, but not necessarily, couple to a high-resistivity substrate. In other cases, a magnetic layer underneath the stripline effectively shields the substrate at the operating frequency of an associated VR.

Thus, significant improvements are still needed in the area of inductor fabrication for voltage regulation.

DESCRIPTION OF THE EMBODIMENTS

Figure 1A:
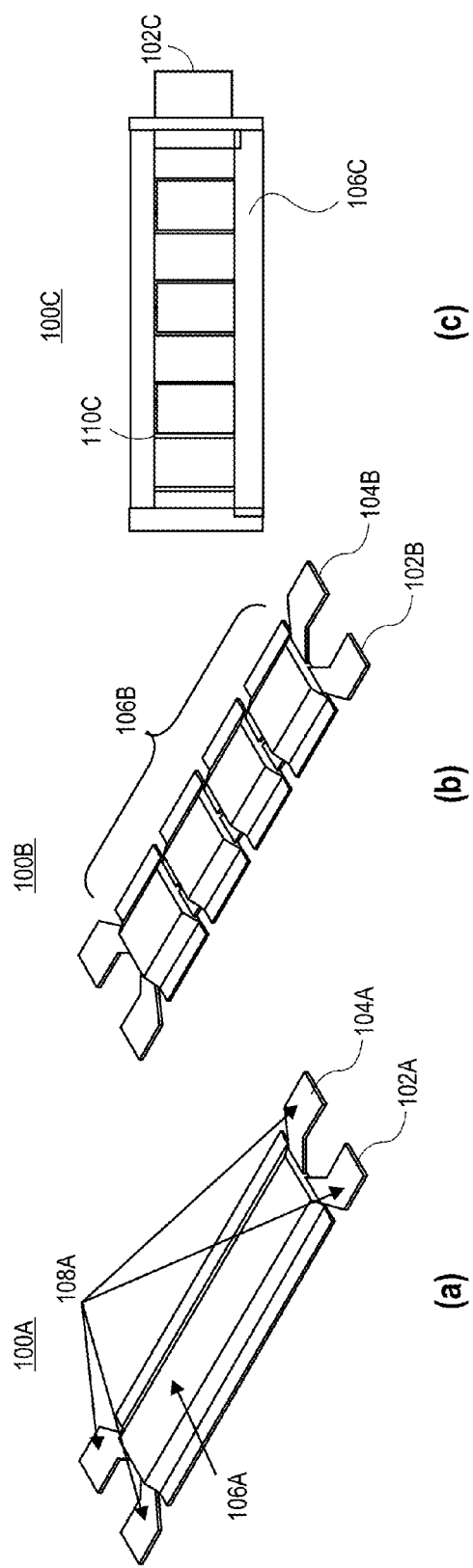
FIG. 1A illustrates (a) a top angled view of a standard magnetic inductor, (b) a top angled view of a slotted magnetic inductor, in accordance with a first embodiment of the present invention, and (c) a plan view of another slotted magnetic inductor, in accordance with a second embodiment of the present invention.

Semiconductor packages including magnetic core inductor (MCI) structures for integrated voltage regulators are described. In the following description, numerous specific details are set forth, such as packaging architectures and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to magnetic inductor structures for integrated voltage regulators. The structures may be designed to provide a reduced associated on die and/or on package capacitor area and to improve efficiency of the inductors and associated voltage regulators. In one such embodiment, approaches or structures described herein enable use of a reduced capacitance while moving to increased frequency for operation of an associated voltage regulator.

In an embodiment, inductor structures involve slotting aspects, i.e., slotted features. Such slotted features may enable mitigation of rapid inductance value drop by capacitive coupling through proximate thin dielectric layers. In one or more embodiments, the magnetic inductors described are magnetic core inductors having a magnetic core made of a ferromagnetic or ferrimagnetic material or alloys, such as iron, ferrite (iron oxide), cobalt or nickel, nickel Iron alloys, cobalt alloys, cobalt iron alloys, Mn alloys and other known soft magnetic materials to increase the inductance.

Since an inductor structure is a key component in modern voltage regulator circuits based on buck or hybrid circuit topologies, one or more embodiments described herein are directed to improving performance of such inductors. More specifically, due to the limited available area for fully integrated (e.g., on-die) voltage regulators (FIVRs) in future integrated circuit (IC) microprocessor technology nodes and in order to reduce the size of power management ICs (PMICs) with integrated inductors, the use of magnetic core inductors (MCIs) is becoming critical. MCIs offer comparable performance to air core inductors (ACIs) but in a much smaller area or volume through the use of high-permeability materials (magnetic materials).

Air core inductors typically require large form factor semiconductor packages, and possibly cored packages. As scaling and die shrinking is performed with each generation, package scaling is often required to provide ever smaller form factors. However, the reduction in package size makes inclusion of ACIs difficult since a smaller package means a smaller inductor which can lead to increased losses for the ACIs. Nonetheless, power management is trending towards the use of FIVRs without a full understanding of the scalability of FIVR components. In the near future, the processor core area is expected to decrease by approximately 50% with each generation. Unfortunately, ACIs cannot scale by the same factor while maintaining the same performance.

As such, the use of MCIs is described herein. MCIs may offer comparable performance to ACIs in a much smaller volume through the use of high permeability materials (e.g., magnetic materials). However, conventional MCIs may suffer from magnetic saturation effects. MCIs are small but have high magnetic fields (i.e., magnetic flux densities) inside the magnetic material. The small size and high magnetic fields can lead to such magnetic saturation which may cause high ripple currents that significantly reduces the efficiency of the MCI. Such an effect may limit the use of MCIs in many power delivery applications requiring large direct current (DC) and alternating current (AC) currents. Additionally, magnetic saturation effects may lead to one or more detriments, such as, but not limited to, limiting the maximum achievable FIVR efficiency, forcing the use of certain MCI topologies which renders the efficient operating region smaller and significantly increases the complexity of the FIVR control circuitry (FIVR controller) design, and requiring large MIM capacitors at the output.

Accordingly, another factor that limits scaling down the area of FIVR circuits and PMICs is the available metal-insulator-metal (MIM) capacitor capacitance density. For example, a certain MIM capacitance value is needed to meet the ripple voltage and transient response requirements of associated voltage regulators. A scaling approach for MIM capacitors could be based on adding additional MIM capacitor material layers. Such an approach, however, results in significantly increased die cost and potential yield issues if the MIM capacitor capacitance value is to remain constant across scaled technology nodes.

Additionally, FIVR and PMICs require both high voltage input (e.g., approximately twice the corresponding gate voltage, Vcc) MIM capacitance and low voltage (Vcc) output MIM capacitance. In order to satisfy these requirements, more complex routing is typically used, while available MIM capacitor area is reduced due to design rule limitations. One option to reduce the required MIM capacitor capacitance value is to increase the switching frequency of the voltage regulator. Unfortunately, however, standard MCIs cannot typically operate at switching frequencies higher than approximately 100 MHz since the associated inductance drops very quickly relative to increasing frequency in that range. Additionally, increasing the switching frequencies can significantly increase associated transistor switching losses. This stems from a large size of the transistors used in FIVR to support the very high turbo mode currents of present computer processing units (CPUs) that are optimized for desktop and laptop applications.

With the current trend towards lower power CPUs and system-on-chip (SoC) products, the maximum turbo currents can be significantly reduced. A reduction in maximum turbo currents can enable use of smaller transistors and, thus, can reduce the switching losses and allow use of high switching frequencies. Additionally, with the general improvement of transistor performance across technology generations, faster compensators can be designed to take advantage of the high switching frequencies and allow extremely fast idle to turbo transitions. Furthermore, the high switching frequencies enable the miniaturization of the overall system, including the inductors and the associated MIM capacitors.

In accordance with an embodiment of the present invention, MCI structures are provided that enable MCI inductors to operate at switching frequencies up to 400 MHz (e.g., up to approximately 4× higher than standard MCIs) with reasonable efficiencies. As a result, significantly smaller MIM capacitors (e.g., nearly $\frac{1}{3}^{rd}$ the size) associated with the inductors may be used. Additionally, in one embodiment, by modifying an MCI die to include an output capacitor, the on-CPU-die MIM capacitor routing can be significantly simplified, and the required overall MIM capacitor area can be further reduced. Also provided herein are actual measurements verifying the characteristics of the described MCI inductors, and simulation data regarding the efficiency of such inductors in a standard voltage regulator. Also, the savings in MIM capacitor area due to splitting the input and output MIM capacitor capacitances is exemplified by placing the MIM capacitors on an associated MCI die.

FIG. 1A illustrates (a) a top angled view of a standard magnetic inductor 100A, (b) a top angled view of a slotted magnetic inductor 100B, in accordance with a first embodiment of the present invention, and (c) a plan view of another slotted magnetic inductor 100C, in accordance with a second embodiment of the present invention. For sake of comparison with embodiments described herein, a standard magnetic core inductor (MCI) structure is shown as 100A in FIG. 1A. The standard MCI 100A includes two copper traces 102A and 104A sandwiched between multi-layered (e.g., laminated) magnetic material 106A. Inductor terminals are shown as 108A. Several thin magnetic layers (e.g., a few hundred nanometers thick) separated by thin dielectric layers (e.g., approximately 25 nm thick) are used in order for the inductor 100A to operate in the 100 MHz range. However, above approximately 500 MHz, the capacitive coupling through the thin dielectric layers causes the inductance value to drop rapidly.

In order to avoid the above described detrimental effect associated with inductor 100A, in accordance with an embodiment of the present invention, the magnetic material layer(s) are sectioned to provided a slotted inductor structure. In a first example, referring to part (b) of FIG. 1A, an inductor structure 100B includes two metal traces 102B and 104B sandwiched between multi-layered (e.g., laminated) magnetic material 106B. The magnetic material 106B is sectioned, e.g., into four sections in the exemplary embodiment of FIG. 1A, part (b). The inductor structure 100B is referred to herein as a type of slotted inductor structure. In one embodiment, by using more sections for the magnetic material, the frequency at which the inductance drops increases significantly, as described in greater detail below in association with FIG. 2, part (a). The higher threshold frequency may be related to the reduction of the conversion of eddy currents inside the magnetic material along the length of the inductor to displacement current across the dielectric. Provided a sufficient number of sections and thin magnetic laminations, the inductance can be maintained relatively constant up to approximately 1 GHz.

Figure 1B:
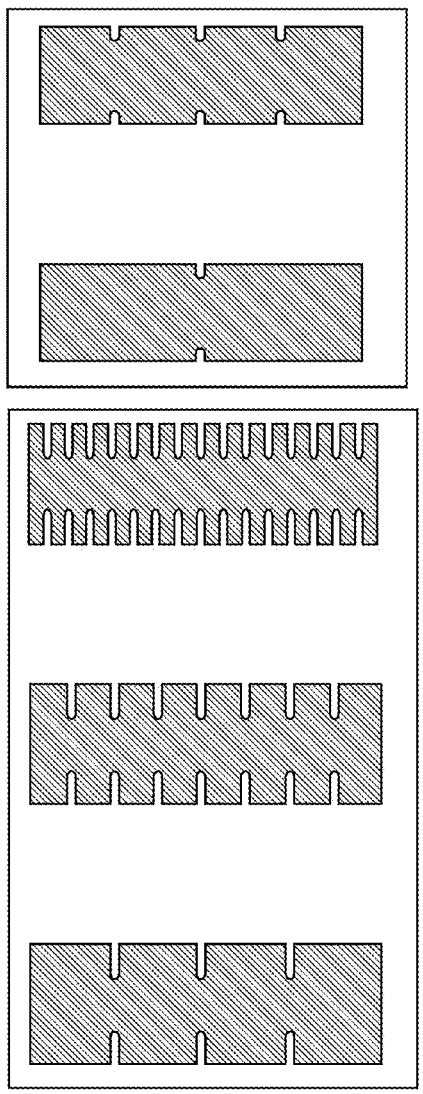
FIG. 1B illustrates a variety of slotting patterns with only partial slots, in accordance with an embodiment of the present invention.
Figure 1C:
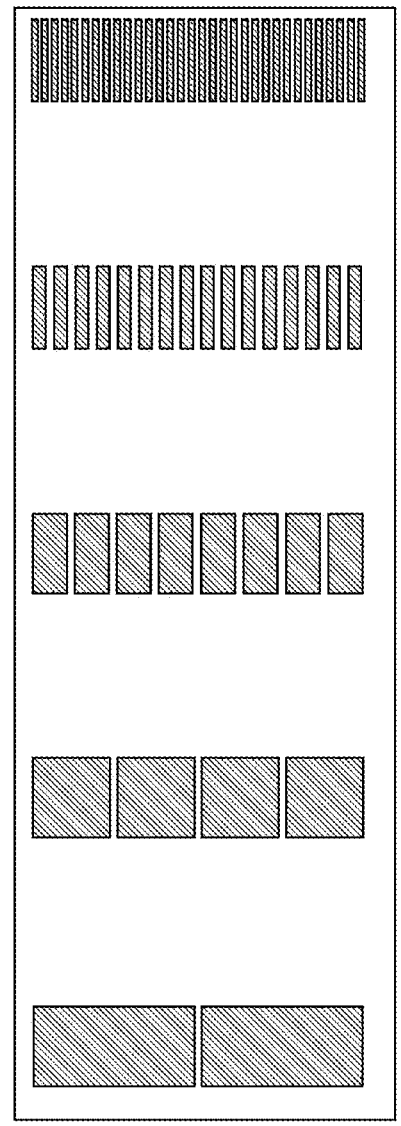
FIG. 1C illustrates a variety of slotting patterns with complete slots, in accordance with an embodiment of the present invention.

It is to be understood that other architectures for slotted inductors are contemplated within the spirit and scope of embodiments of the present invention. For example, only a top magnetic layer may be slotted, only a bottom magnetic layer may be slotted, or irregular slotting may be used. An example of the last embodiment is shown in FIG. 1A, part (c), where inductor structure 100C includes metal (e.g., copper) layer 102C and a plurality of magnetic material layers 106C having irregular slotting 110C therein. As a comparison, inductor structure 100B has regular slotting in that all magnetic layers are slotted in the same location. In other examples, FIG. 1B illustrates a variety of slotting patterns with only partial slots, in accordance with an embodiment of the present invention. In other examples, FIG. 1C illustrates a variety of slotting patterns with complete slots, in accordance with an embodiment of the present invention. Other possibilities include, but are not limited to, in one or more embodiments, slotting of wings only, slotting of body only, slotting all the way across, or a combination of wing slotting and partial body slotting.

Figure 2:
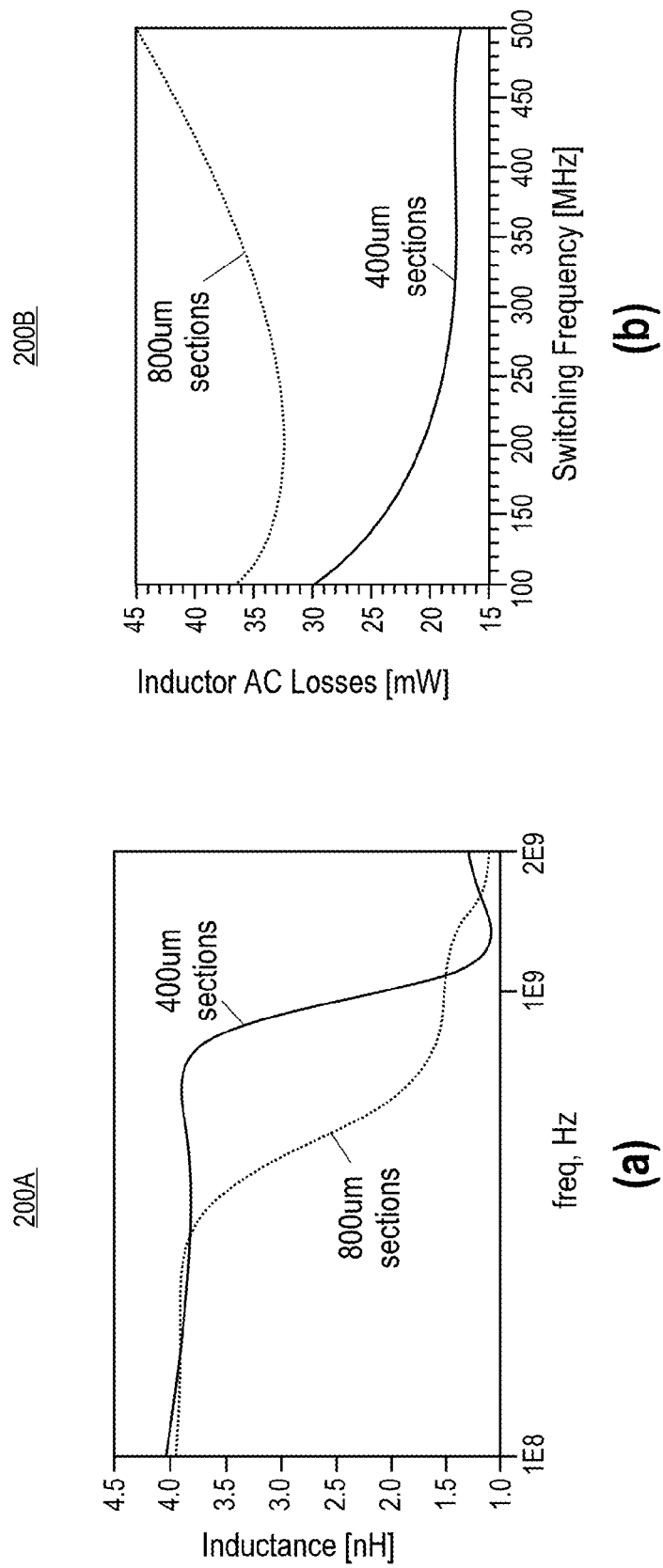
FIG. 2 includes (a) a plot of inductance (in nH) as a function of Frequency (in Hz) for two different inductors, and (b) a plot of inductor AC losses (in mW) as a function of switching frequency (in MHz), in accordance with an embodiment of the present invention.

FIG. 2 includes (a) a plot 200A of inductance (in nH) as a function of Frequency (in Hz) for two different inductors, and (b) a plot 200B of inductor AC losses (in mW) as a function of switching frequency (in MHz), in accordance with an embodiment of the present invention.

Referring to plot 200A by introducing slotting (e.g., 1 slot in an 800 micron long inductor to provide an inductor with two 400 micron sections), the frequency at which inductance falls off for a given length inductor (e.g., an 800 micron inductor) is significantly increased. Referring to plot 200B, the inductor AC losses in a buck regulator are shown as a function of the switching frequency. By slotting the inductor (e.g., 1 slot in an 800 micron long inductor to provide an inductor with two 400 micron sections), reduces the losses by 8% even at low switching frequency and by more than 30% at higher frequencies. For an inductor that is constant with frequency, the AC losses decrease as the switching frequency increases. However, for standard unslotted MCIs the AC losses remain relatively flat above approximately 150 MHz, and then begin increasing beyond approximately 250 MHz since the inductance also drops with frequency, as shown in plot 200A.

By slotting one or more magnetic layers in a magnetic core inductor, lower losses at higher switching frequency can be achieved. Lower losses may be especially important for SoC market segments (e.g., tablets/handheld devices) since they operate at very low load currents and inductor AC losses are a significant fraction of the overall losses. Furthermore, increasing the switching frequency can reduce the required MIM capacitor capacitance value to achieve a certain ripple voltage and stable compensator.

Figure 3:
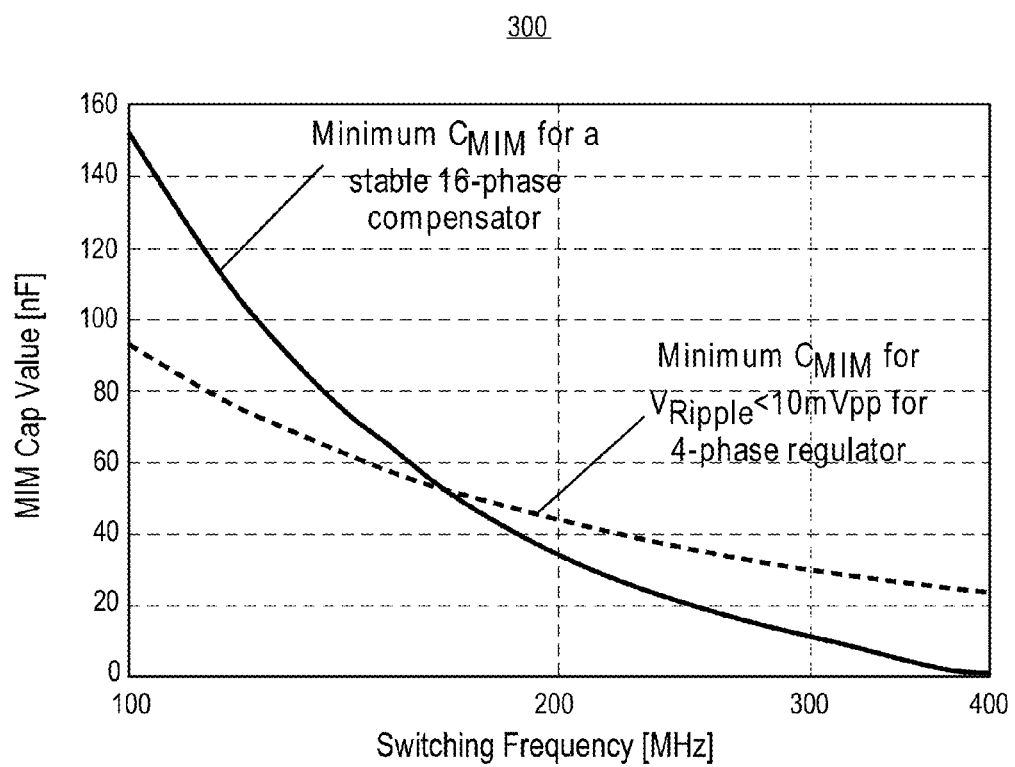
FIG. 3 is a plot of MIM capacitance value (in nF) as a function of switching frequency (in MHz), in accordance with an embodiment of the present invention.

For example, FIG. 3 is a plot 300 of on die/on package capacitance value (in nF) as a function of switching frequency (in MHz), in accordance with an embodiment of the present invention. Referring to plot 300, a minimum output capacitor capacitance for a ripple voltage of less than 10 mV and stable compensator as a function of the switching frequency is provided. The calculations were performed using simplified capacitor and compensator models. However, the models show the expected trend of the reduction of the MIM capacitor capacitance with higher switching frequencies. The worst case scenarios were used in the simulation (e.g., a compensator for a 16 phase regulator and ripple voltage for a 4 phase regulator). It is to be understood that other efficiency and system design considerations might prevent operation above approximately 250 MHz due to transistor losses.

As described above, a metal-insulator-metal (MIM) capacitor may be integrated, at least on an architectural level, with a slotted inductor structure for use in an FIVR. As an example, FIG. 4 illustrates a plan view of a MIM capacitor structure for use in a FIVR, in accordance with an embodiment of the present invention.

Figure 4:
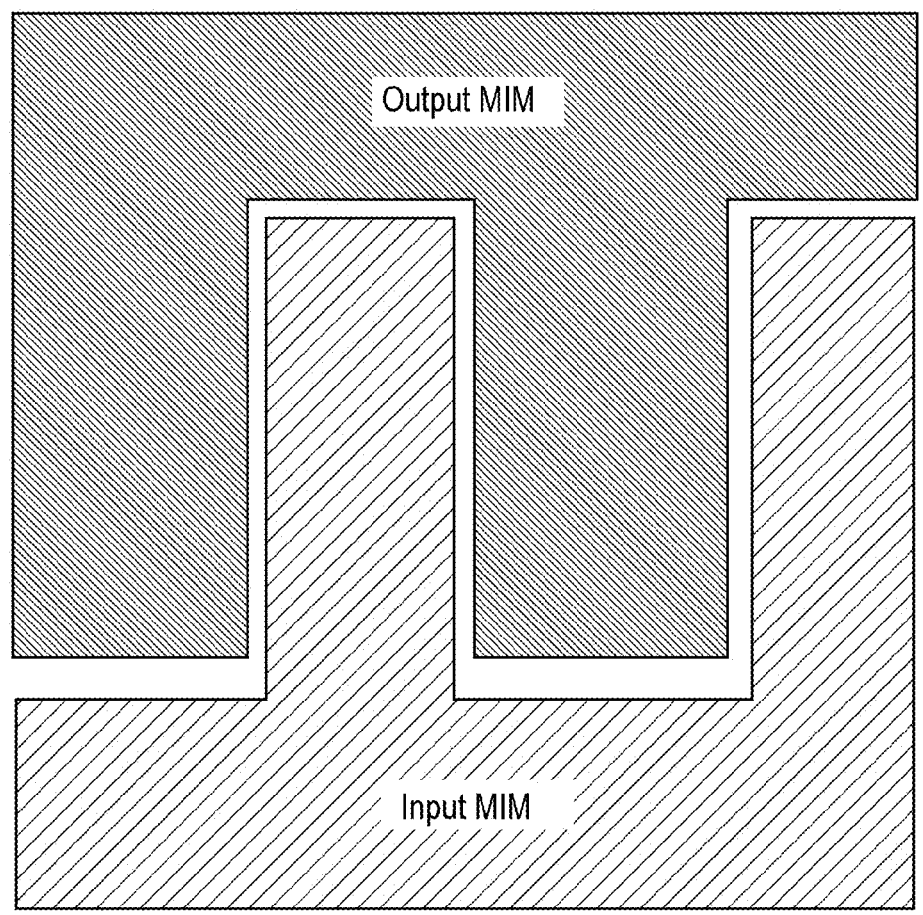
FIG. 4 illustrates a plan view of a metal-insulator-metal (MIM) capacitor structure for use in a fully integrated voltage regulator (FIVR), in accordance with an embodiment of the present invention.

Referring to FIG. 4, a MIM capacitor structure includes an input MIM portion and an output MIM portion. The switching activity of a corresponding buck regulator and the load transitions of a CPU core can create a large amount of noise. The high frequency components of this noise are decoupled using a MIM capacitor, such as the MIM capacitor structure of FIG. 4. In an embodiment, the two capacitors share a same area. Routing overhead can be very significant and, thus, splitting the capacitors can help reduce the area.

By contrast, in conventional approaches, as the logic and FIVR circuits scale with technology scaling, the MIM capacitor density must increase such that the reduced available area is used to obtain the same amount of total MIM capacitor capacitance. Such an increase in MIM capacitor density could be achieved by adding additional layers to a MIM capacitor stack. However, this approach adds process cost and reduces yield in an expensive, leading-edge CPU fabrication process. Increasing the capacitance can require significant increase in the die cost.

Figure 5:
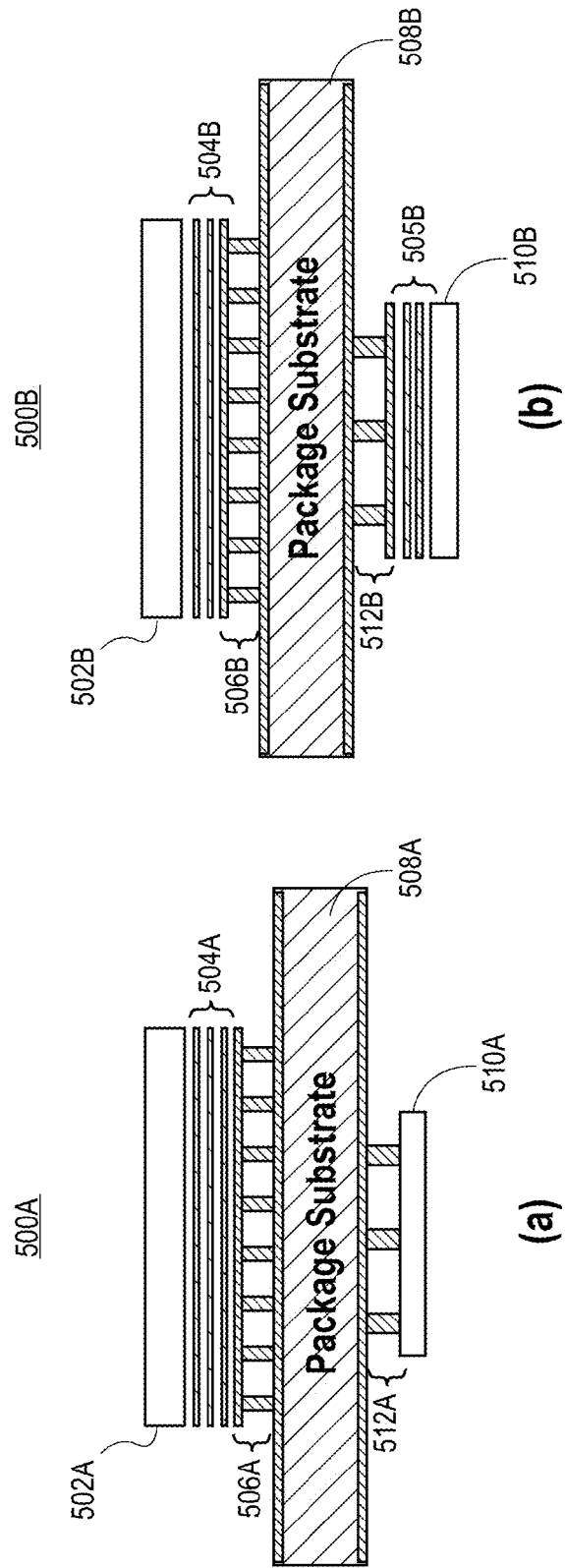
FIG. 5 includes illustrations of cross-sectional views of (a) a conventional package arrangement for a metal-insulator-metal (MIM) capacitor and associated scaling approach, and (b) a package arrangement for a MIM capacitor and associated scaling approach in accordance with an embodiment of the present invention.

To better exemplify the issues at hand, FIG. 5 includes illustrations of cross-sectional views of (a) a conventional package arrangement 500A for a metal-insulator-metal (MIM) capacitor and associated scaling approach, and (b) a package arrangement 500B for a MIM capacitor and associated scaling approach in accordance with an embodiment of the present invention. Referring to conventional MIM capacitor package 500A, a CPU die 502A disposed above a MIM capacitor 504A which is disposed above a plurality of electrodes 506A disposed on a first side of a package substrate 508A. On a second side of the package substrate 508A, a magnetic core inductor (MCI) die 510A is coupled to the package substrate 508A and, ultimately, to the CPU die 502A and the MIM capacitor 504A by electrodes 512A. A potential solution would be to double the MIM layer by duplicating all of the process steps, but this obviously increases die cost. It is to be understood that, in an embodiment, the MIM capacitor is integrated in the CPU die. In another embodiment, the MIM capacitor is an integral part of the MCI die. In one such embodiment, the MIM capacitor is formed in layers on a same silicon substrate as the MCI die or on an interposer coupled to the MCI die. It is to be understood, then, that the MIM capacitor can be fabricated in a CPU die (front-side or backside of the die), or on an MCI die, or on an interposer.

By contrast, referring to MIM capacitor package 500B, a CPU die 502B is disposed above a first MIM capacitor 504B which is disposed above a plurality of electrodes 506B disposed on a first side of a package substrate 508B. On a second side of the package substrate 508B, a magnetic core inductor (MCI) die 510B is disposed on a second MIM capacitor 505B. The MCI die 510B and the second MIM capacitor 505B are coupled to the package substrate 508B and, ultimately, to the CPU die 502B and the MIM capacitor 504B by electrodes 512B. The implementation shown in FIG. 5, part (b), involves use of a CPU die which retains a smaller number of MIM cap electrodes even as technology nodes are scaled. This enables Vccin decoupling, while additional MIM capacitor capacitance needs for the output filter are satisfied by introducing MIM capacitor layers on the MCI die.

Figure 6:
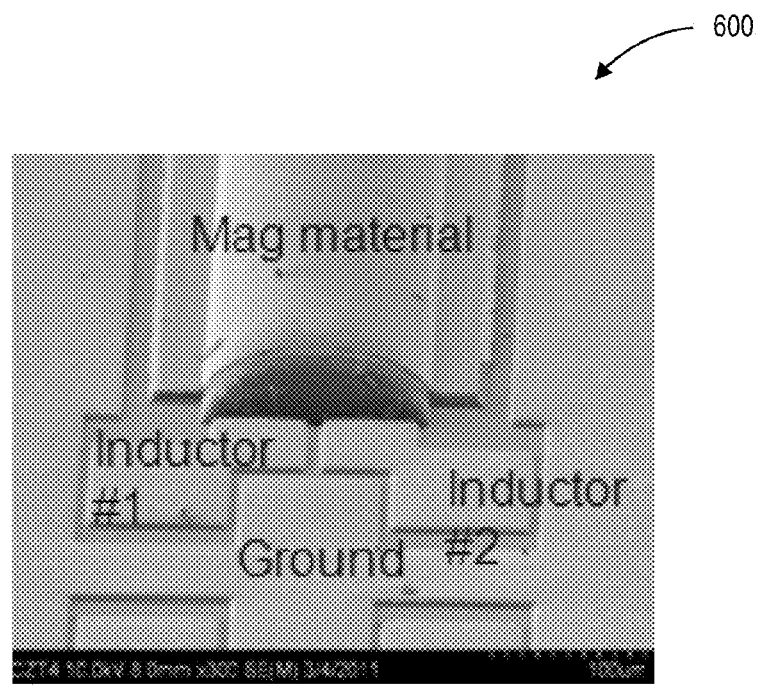
FIG. 6 is a scanning electron microscope (SEM) image of a top angled view of a slotted inductor structure, in accordance with an embodiment of the present invention.

FIG. 6 is a scanning electron microscope (SEM) image 600 of a top angled view of a slotted inductor structure, in accordance with an embodiment of the present invention. Referring to image 600, more than one slotted inductor may share the same magnetic material (shown here in the form of a magnetic dome) and, possibly, ground electrode, such as inductors #1 and #2 which share a ground electrode and a magnetic material portion. Also seen is the top of magnetic dome.

Figure 7:
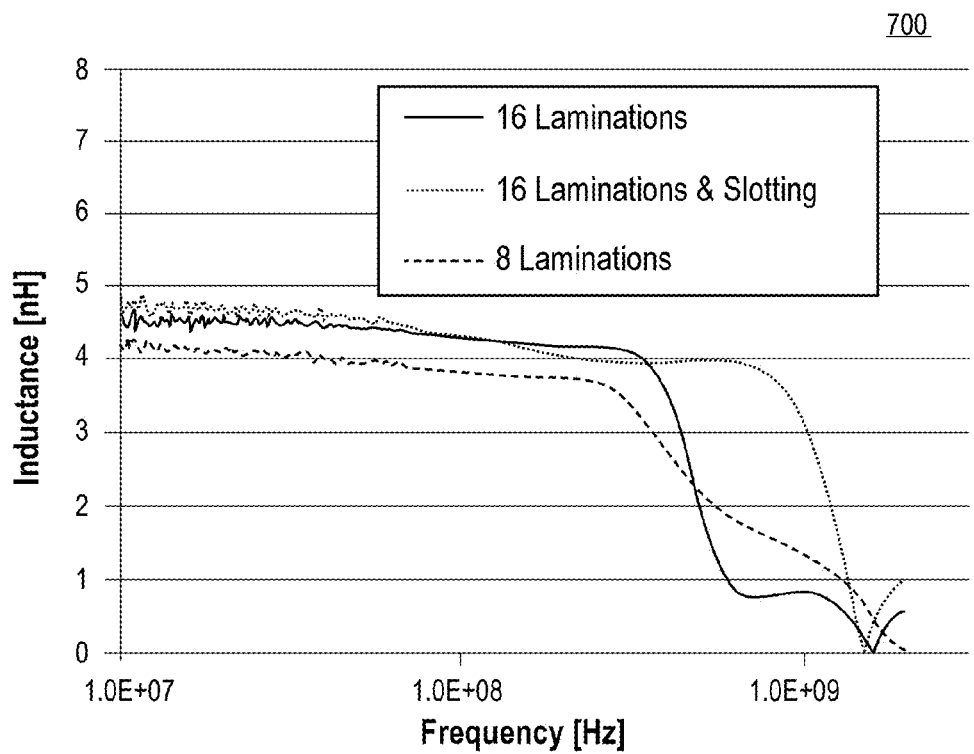
FIG. 7 is a plot of inductance (in nH) as a function of frequency (in Hz) for three different inductor structure types, in accordance with an embodiment of the present invention.

FIG. 7 is a plot 700 of inductance (in nH) as a function of frequency (in Hz) for three different inductor structure types, in accordance with an embodiment of the present invention. Referring to plot 700, a response for inductors based on 8 or 16 magnetic layer laminations (non-slotted) is relatively similar. However, a slotted inductor structure based on 16 magnetic layer laminations maintains inductance for a considerably higher range of frequencies as compared with unslotted counterparts. Thus, the measured results reveal that slotting the inductors improves the efficiency and maintains constant inductance up to approximately 1 GHz.

Forming a slotted magnetic structure can be performed in a variety of approaches for magnetic layers or layer stacks. Generally, in an embodiment, a method of fabricating a magnetic core inductor (MCI) die involves forming, by a first sputtering process, a first slotted magnetic material structure above a substrate. One or more metal lines is then formed above the first slotted magnetic material structure. The method further involves forming, by a second sputtering process, a second slotted magnetic material structure above the one or more metal lines. In one such embodiment, the first or the second, or both, sputtering process involves sputtering a magnetic material and, subsequently, slotting the magnetic material with an etch process. In another such embodiment, the first or the second, or both, sputtering process involves sputtering a magnetic material and, subsequently, slotting the magnetic material with a lift-off process. In another such embodiment, the first or the second, or both, sputtering process involves sputtering a magnetic material onto a patterned insulator structure disposed above the one or more metal lines and, subsequently, slotting the magnetic material with a polishing process. In yet another such embodiment, the first or the second, or both, sputtering process involves sputtering a magnetic material while using a shadow mask for slotting the magnetic material during the sputtering. Approaches other than sputtering a magnetic layer or a plurality of magnetic layers, and the resulting slotted inductor structures, can be as described in U.S. Pat. No. 7,518,481, "Slotted magnetic material for integrated circuit inductors," and U.S. Pat. No. 8,108,984, "Method for manufacturing integrated circuit inductors having slotted magnetic material," both of which are incorporated by reference herein. Other examples include the use of electroplating instead of sputtering for magnetic material deposition. Other applicable techniques include, but are not limited to, spin-spray, RF sputtering, electroplating, DC magnetron sputter, or ion beam sputter.

General application to the above described embodiments include, but are not limited to, advanced FIVR and PMIC scaling, as enabled by the above description. Furthermore, such implementations are scalable for future technology nodes.

More generally, a semiconductor package including a magnetic core inductor structure for an integrated voltage regulator can be based on a variety of packaging options. In one such option, conventional flip-chip arrangements are used where, e.g., one or both of a CPU die and a MCI die (each having MIM capacitor layers thereon) are flip-chip bonded to a package substrate. An example is shown in FIG. 5, part (b). Another such option is housing one or both of a CPU die and an MCI die in a coreless substrate formed by a BBUL process. BBUL is a processor packaging technology that is bumpless since it does not use the usual small solder bumps to attach the silicon die to the processor package wires. It has build-up layers since it is grown or built-up around the silicon die. Some semiconductor packages now use a coreless substrate, which does not include the thick resin core layer commonly found in conventional substrates. In an embodiment, as part of the BBUL process, electrically conductive vias and routing layers are formed above an active side of the semiconductor die using a semi-additive process (SAP) to complete remaining layers. In an embodiment, an external contact layer is formed. In one embodiment, an array of external conductive contacts is a ball grid array (BGA). In other embodiments, the array of external conductive contacts is an array such as, but not limited to, a land grid array (LGA) or an array of pins (PGA).

In an embodiment, a substrate is a coreless substrate since a panel is used to support packaging of a semiconductor die through to formation of an array of external conductive conducts. The panel is then removed to provide a coreless package for the semiconductor die. Accordingly, in an embodiment, the term "coreless" is used to mean that the support upon which the package was formed for housing a die is ultimately removed at the end of a build-up process. In a specific embodiment, a coreless substrate is one that does not include a thick core after completion of the fabrication process. As an example, a thick core may be one composed of a reinforced material such as is used in a motherboard and may include conductive vias therein. It is to be understood that die-bonding film may be retained or may be removed. In either case, inclusion or exclusion of a die-bonding film following removal of the panel provides a coreless substrate. Still further, the substrate may be considered a coreless substrate because it does not include a thick core such as a fiber reinforced glass epoxy resin.

A packaged semiconductor die may, in an embodiment, be a fully embedded and surrounded semiconductor die. As used in this disclosure, "fully embedded and surrounded" means that all surfaces of the semiconductor die are in contact with an encapsulating film (such as a dielectric layer) of substrate, or at least in contact with a material housed within the encapsulating film. Said another way, "fully embedded and surrounded" means that all exposed surfaces of the semiconductor die are in contact with the encapsulating film of a substrate.

A packaged semiconductor die may, in an embodiment, be a fully embedded semiconductor die. As used in this disclosure, "fully embedded" means that an active surface and the entire sidewalls of the semiconductor die are in contact with an encapsulating film (such as a dielectric layer) of a substrate, or at least in contact with a material housed within the encapsulating film. Said another way, "fully embedded" means that all exposed regions of an active surface and the exposed portions of the entire sidewalls of the semiconductor die are in contact with the encapsulating film of a substrate. However, in such cases, the semiconductor die is not "surrounded" since the backside of the semiconductor die is not in contact with an encapsulating film of the substrate or with a material housed within the encapsulating film. In a first embodiment, a back surface of the semiconductor die protrudes from the global planarity surface of the die side of a substrate. In a second embodiment, no surface of the semiconductor die protrudes from the global planarity surface of the die side of a substrate.

In contrast to the above definitions of "fully embedded and surrounded" and "fully embedded," a "partially embedded" die is a die having an entire surface, but only a portion of the sidewalls, in contact with an encapsulating film of a substrate (such as a coreless substrate), or at least in contact with a material housed within the encapsulating film. In further contrast, a "non-embedded" die is a die having at most one surface, and no portion of the sidewalls, in contact with an encapsulating film of a substrate (such as a coreless substrate), or in contact with a material housed within the encapsulating film.

In an embodiment, a semiconductor package for housing a semiconductor die packaged with an MCI structure includes a foundation substrate at the land side of the substrate. For example, where the semiconductor die is part of a hand-held device such as a smart phone embodiment or a hand-held reader embodiment, the foundation substrate may be a motherboard, an external shell such as the portion an individual touches during use, or both the motherboard and an external shell such as the portion an individual touches during use.

In another aspect, a semiconductor die packaged with an MCI structure is housed in a core of a substrate. In one such embodiment, the semiconductor die and the MCI structure are embedded within the same core material. The packaging processes may, in an embodiment, be performed on a carrier. A carrier, such as a panel, may be provided having a plurality of cavities disposed therein, each sized to receive a semiconductor die and MCI structure pairing. During processing, identical structures may be mated in order to build a back-to-back apparatus for processing utility. Consequently, processing throughput is effectively doubled. For example, a panel may include 1000 recesses on either side, allowing for fabrication of 2000 individual packages from a single panel.

In an embodiment, one or more of the above described semiconductor packages housing a semiconductor die and an MCI structure are paired with other packages following the packaging process, e.g., the coupling of a packaged memory die with a package logic die. In an example, connections between two or more individually packaged die may be made post BBUL fabrication by using thermal compression bonding (TCB) processing. In another embodiment, more than one die are embedded in the same package. For example, in one embodiment, a packaged semiconductor die and MCI structure pairing further includes a secondary stacked die. The first die may have one or more through-silicon vias disposed therein (TSV die). The second die may be electrically coupled to the TSV die through the one or more through-silicon vias. The apparatus may also include a coreless substrate. In one embodiment, all die are embedded in the coreless substrate.

Thus, embodiments of the present invention enable fabrication of packaged semiconductor die co-packaged with MCI structures, or multiple MCIs. Such embodiments may provide benefits such as, but not limited to, cost reduction. The unique combination of components and techniques described herein may be fully compatible with conventional equipment toolsets. In an embodiment, such apparatuses provide integrated voltage regulators (IVRs) implementing magnetic core inductors to improve efficiency.

Figure 8:
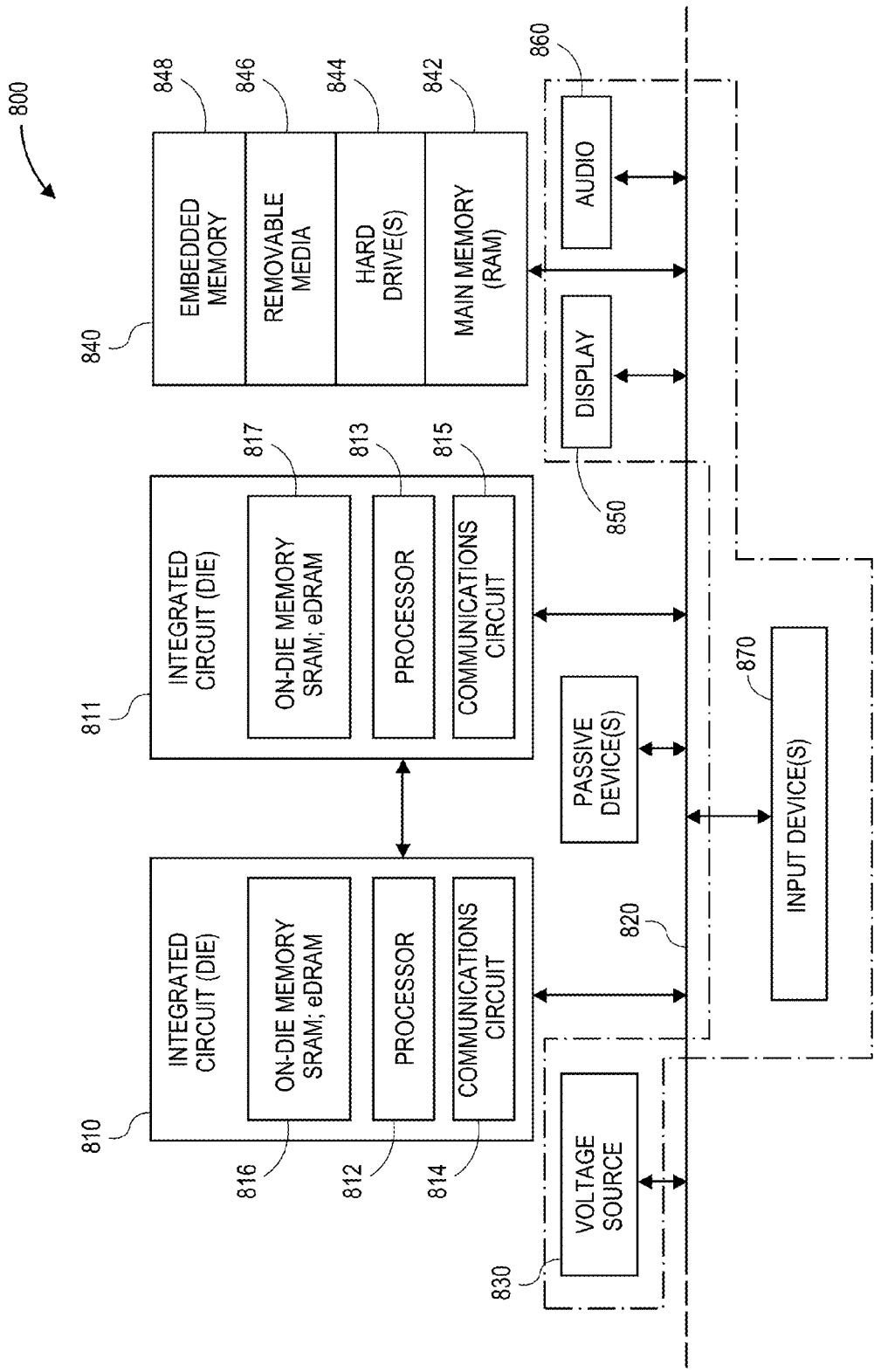
FIG. 8 is a schematic of a computer system, in accordance with an embodiment of the present invention.

FIG. 8 is a schematic of a computer system 800, in accordance with an embodiment of the present invention. The computer system 800 (also referred to as the electronic system 800) as depicted can embody a semiconductor die packaged with an MCI structure according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes a semiconductor die packaged with an MCI structure, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems. In an embodiment, the processor 810 includes on-die memory 816 such as static random-access memory (SRAM). In an embodiment, the processor 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in an embedded TSV die stack, according to an embodiment.

In an embodiment, the electronic system 800 also includes a display device 850 and an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a semiconductor die packaged with an MCI structure according to any of the several disclosed embodiments and their equivalents, an electronic system, a computer system, one or more methods of fabricating an integrated circuit, and one or more methods of fabricating an electronic assembly that includes a semiconductor die packaged with an MCI structure according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with an MCI structure embodiments and their equivalents. A foundation substrate may be included, as represented by the dashed line of FIG. 8. Passive devices may also be included, as is also depicted in FIG. 8.

Embodiments of the present invention include semiconductor packages including magnetic core inductor (MCI) structures for integrated voltage regulators.

In an embodiment, a semiconductor package includes a package substrate and a semiconductor die coupled to a first surface of the package substrate. The semiconductor die has a first plurality of metal-insulator-metal (MIM) capacitor layers thereon. The semiconductor package also includes a magnetic core inductor (MCI) die coupled to a second surface of the package substrate. The MCI die includes one or more slotted inductors and has a second plurality of MIM capacitor layers thereon.

In one embodiment, each of the one or more slotted inductors of the MCI die includes a plurality of magnetic layers. All the magnetic layers of the plurality of magnetic layers are slotted with a regular pattern.

In one embodiment, each of the one or more slotted inductors of the MCI die comprise a plurality of magnetic layers, and wherein all the magnetic layers of the plurality of magnetic layers are slotted with an irregular pattern.

In one embodiment, each of the one or more slotted inductors of the MCI die comprise a plurality of magnetic layers, and wherein only a portion of, but not all of, the magnetic layers of the plurality of magnetic layers are slotted.

In one embodiment, the one or more slotted inductors, the first plurality of MIM capacitor layers, and the second plurality of MIM capacitor layers form a portion of an integrated voltage regulator for the semiconductor die.

In one embodiment, the first plurality of MIM capacitor layers of the semiconductor die are proximate to the first surface of the package substrate, and the semiconductor die is coupled to the package substrate by a first plurality of contacts.

In one embodiment, the second plurality of MIM capacitor layers of the MCI die are proximate to the second surface of the package substrate, and the MCI die is coupled to the package substrate by a second plurality of contacts.

In one embodiment, the first and second pluralities of contacts are electrically coupled by interconnects of the package substrate.

In one embodiment, the first and second surfaces are on opposing sides of the package substrate.

In one embodiment, the first and second surfaces are on a same side of the package substrate.

In one embodiment, both the semiconductor die and the MCI die are flip-chip bonded to the package substrate.

In one embodiment, the package substrate is a bumpless build-up layer (BBUL) substrate.

In one embodiment, the semiconductor die and the magnetic core inductor die are housed in a core of the package substrate.

In one embodiment, the package substrate is a coreless substrate.

In an embodiment, a magnetic core inductor (MCI) die includes a substrate and one or more slotted inductors disposed above the substrate. A plurality of metal-insulator-metal (MIM) capacitor layers is disposed above the one or more slotted inductors.

In one embodiment, each of the one or more slotted inductors includes a plurality of magnetic layers, and all the magnetic layers of the plurality of magnetic layers are slotted with a regular pattern.

In one embodiment, each of the one or more slotted inductors has a plurality of magnetic layers, and all the magnetic layers of the plurality of magnetic layers are slotted with an irregular pattern.

In one embodiment, each of the one or more slotted inductors has a plurality of magnetic layers, and only a portion of, but not all of, the magnetic layers of the plurality of magnetic layers are slotted.

In an embodiment, a method of fabricating a magnetic core inductor (MCI) die involves forming, by a first sputtering process, a first slotted magnetic material structure above a substrate. One or more metal lines is then formed above the first slotted magnetic material structure. The method further involves forming, by a second sputtering process, a second slotted magnetic material structure above the one or more metal lines.

In one embodiment, the first and second sputtering processes each involve sputtering a magnetic material and, subsequently, slotting the magnetic material with a lithography and etching process.

In one embodiment, the first and second sputtering processes each involve sputtering a magnetic material and, subsequently, slotting the magnetic material with a lift-off process.

In one embodiment, the first and second sputtering processes each involve sputtering a magnetic material onto a patterned insulator structure disposed above the one or more metal lines and, subsequently, slotting the magnetic material with a polishing process.

In one embodiment, the first and second sputtering processes each involve sputtering a magnetic material while using a shadow mask for slotting the magnetic material during the sputtering.

In one embodiment, the method further involves forming a plurality of metal-insulator-metal (MIM) capacitor layers above the second slotted magnetic material structure.

In one embodiment, the first slotted magnetic material structure has a different slotting pattern than the second slotted magnetic material structure.

What is claimed is:
1. A semiconductor package, comprising:
a package substrate;

a semiconductor die coupled to a first surface of the package substrate, the semiconductor die having a first plurality of metal-insulator-metal (MIM) capacitor layers thereon; and a magnetic core inductor (MCI) die coupled to a second surface of the package substrate, the MCI die comprising one or more slotted inductors and having a second plurality of MIM capacitor layers thereon.

2. The semiconductor package of claim 1, wherein each of the one or more slotted inductors of the MCI die comprises a plurality of magnetic layers, and wherein all the magnetic layers of the plurality of magnetic layers are slotted with a regular pattern.

3. The semiconductor package of claim 1, wherein each of the one or more slotted inductors of the MCI die comprises a plurality of magnetic layers, and wherein all the magnetic layers of the plurality of magnetic layers are slotted with an irregular pattern.

4. The semiconductor package of claim 1, wherein each of the one or more slotted inductors of the MCI die comprises a plurality of magnetic layers, and wherein only a portion of, but not all of, the magnetic layers of the plurality of magnetic layers are slotted.

5. The semiconductor package of claim 1, wherein the one or more slotted inductors, the first plurality of MIM capacitor layers, and the second plurality of MIM capacitor layers form a portion of an integrated voltage regulator for the semiconductor die.

6. The semiconductor package of claim 1, wherein the first plurality of MIM capacitor layers of the semiconductor die are proximate to the first surface of the package substrate, and wherein the semiconductor die is coupled to the package substrate by a first plurality of contacts.

7. The semiconductor package of claim 6, wherein the second plurality of MIM capacitor layers of the MCI die are proximate to the second surface of the package substrate, and wherein the MCI die is coupled to the package substrate by a second plurality of contacts.

8. The semiconductor package of claim 7, wherein the first and second pluralities of contacts are electrically coupled by interconnects of the package substrate.

9. The semiconductor package of claim 1, wherein the first and second surfaces are on opposing sides of the package substrate.

10. The semiconductor package of claim 1, wherein the first and second surfaces are on a same side of the package substrate.

11. The semiconductor package of claim 1, wherein both the semiconductor die and the MCI die are flip-chip bonded to the package substrate.

12. The semiconductor package of claim 1, wherein the package substrate is a bumpless build-up layer (BBUL) substrate.

13. The semiconductor package of claim 1, wherein the semiconductor die and the magnetic core inductor die are housed in a core of the package substrate.

14. The semiconductor package of claim 1, wherein the package substrate is a coreless substrate.

15. A magnetic core inductor (MCI) die, comprising:
a substrate;
one or more slotted inductors disposed above the substrate comprising a plurality of magnetic layers; and
a plurality of metal-insulator-metal (MIM) capacitor layers disposed above the one or more slotted inductors.

16. The MCI die of claim 15, wherein each of the one or more slotted inductors comprising the plurality of magnetic layers, and wherein all the magnetic layers of the plurality of magnetic layers are slotted with a regular pattern.

17. The MCI die of claim 15, wherein each of the one or more slotted inductors comprising the plurality of magnetic layers, and wherein all the magnetic layers of the plurality of magnetic layers are slotted with an irregular pattern.

18. The MCI die of claim 15, wherein each of the one or more slotted inductors comprising the plurality of magnetic layers, and wherein only a portion of, but not all of, the magnetic layers of the plurality of magnetic layers are slotted.

* * * * *